United States Patent [19]
Arai et al.

[11] Patent Number: 5,424,579
[45] Date of Patent: Jun. 13, 1995

[54] SEMICONDUCTOR DEVICE HAVING LOW FLOATING INDUCTANCE

[75] Inventors: Kiyoshi Arai; Yoshio Takagi, both of Fukuoka, Japan

[73] Assignee: Mitsubishi Denki Kabushiki Kaisha, Tokyo, Japan

[21] Appl. No.: 84,957

[22] Filed: Jul. 2, 1993

[30] Foreign Application Priority Data

Jul. 21, 1992 [JP] Japan ............... 4-193979

[51] Int. Cl.⁶ ............ H01L 23/02; H01L 23/12; H01L 23/48; H01I 29/44
[52] U.S. Cl. ............ 257/690; 257/689; 257/691; 257/692; 257/693; 257/734
[58] Field of Search ............ 257/691, 692, 693, 698, 257/690, 699, 701, 678, 734, 689, 696

[56] References Cited

U.S. PATENT DOCUMENTS

| | | | |
|---|---|---|---|
| 4,907,068 | 3/1990 | Amann et al. | 357/74 |
| 5,027,192 | 6/1991 | Kloucek | . |
| 5,202,578 | 4/1993 | Hideshima | 257/690 |

FOREIGN PATENT DOCUMENTS

| | | |
|---|---|---|
| 0277546 | 1/1988 | European Pat. Off. |
| 0381849 | 12/1989 | European Pat. Off. |
| 0427143 | 11/1990 | European Pat. Off. |
| 62-160558 | 10/1987 | Japan |
| 384643 | 8/1991 | Japan |

Primary Examiner—Ngân V. Ngô
Assistant Examiner—Carl Whitehead, Jr.
Attorney, Agent, or Firm—Leydig, Voit & Mayer

[57] ABSTRACT

A first composite substrate including an insulating substrate, a copper pattern, and a copper layer on opposite surfaces is mounted on a metal base plate. A second composite substrate and semiconductor chips are mounted on the first composite substrate and interconnected by wire bonding. The paths of current flowing in the wires and in a copper pattern of the second composite substrate are antiparallel to the paths of current flowing in respective corresponding portions of the first composite substrate. A semiconductor device is produced in which an increasing switching frequency does not increase a surge voltage generated in ON and OFF switching operations.

22 Claims, 11 Drawing Sheets

SEMICONDUCTOR DEVICE HAVING LOW FLOATING INDUCTANCE

BACKGROUND OF THE INVENTION

1. Field of the Invention

The present invention relates to a semiconductor device and a method of fabricating the same. More particularly, the invention relates to a semiconductor device having a reduced floating inductance and a method of fabricating the same.

2. Description of the Background Art

FIG. 15 shows a conventional composite substrate 50 with thick copper foil for a power module in top plan view, in cross section and in bottom plan view.

The composite substrate 50 includes a ceramic insulating substrate 51, a circuit pattern 52 deposited on one surface of the ceramic insulating substrate 51, and a back pattern 53 deposited on the other surface thereof.

In FIG. 16, there is shown, in perspective, a conventional semiconductor device 60 including the composite substrate 50. The semiconductor device 60 comprises a copper base plate 1, the composite substrate 50, a power semiconductor element 12, aluminum wires 13, main electrode terminals 62, a control electrode terminal 63, and a case 61.

FIG. 17 shows a main current path 64 of the semiconductor device 60 in practical use. It will be apparent from the comparison between FIGS. 16 and 17 that the main current path 64 from one of the main electrode terminals 62 leads to the semiconductor chips 19 and then runs through the wires 13 and part of the circuit pattern 52 to exit at another main electrode terminal 62.

Such a semiconductor device is used as a power switching device, repeating ON/OFF operation. As MOS power devices have been recently put to practical use, the switching frequency is very high, commonly in the range of 20 to 30 KHz. The switching frequency is expected to increase.

As the switching frequency increases, the rate of current change per time di/dt rises in ON-to-OFF and OFF-to-ON operation. This causes a surge voltage $V = L \cdot di/dt$ in ON-to-OFF operation due to a floating inductance L present in the main current path 64. An increase in the floating inductance L results in an increase in surge voltage. When the increasing surge voltage exceeds the rating of the power semiconductor elements 12, the power semiconductor elements 12 break down.

SUMMARY OF THE INVENTION

A feature of the present invention is a semiconductor device for controlling an input current in a semiconductor chip to provide an output current wherein conductive layers or wires are arranged such that the path of the input current is antiparallel to the path of the output current.

The semiconductor devices according to first and second aspects to be described later employ an arrangement for improvement in the interrelation between the conductive layers, and the semiconductor device of a third aspect improves the relationship between the conductive layers and wires.

According to the first aspect of the present invention, a semiconductor device for controlling an input current by a semiconductor chip to provide an output current, comprises: (a) a metal base plate having a major surface; (b) a first insulating substrate disposed on the major surface of the metal base plate; (c) a first conductive layer on the first insulating substrate and having a first portion for conducting one of the input and output currents in a first direction parallel to the major surface; (d) a second insulating substrate selectively provided on the first conductive layer; (e) a second conductive layer provided on the second insulating substrate and having a second portion for conducting the other current in a second direction antiparallel to the first direction, the second portion overlying the first portion; and (f) a semiconductor chip disposed on the first or second conductive layer and connected electrically to the first and second conductive layers.

In the semiconductor device according to the first aspect, the input and output currents flow in the first and second conductive layers antiparallel with each other, so that the respective magnetic fields generated by the input and output currents cancel each other. As the result, a floating inductance decreases, and a high surge voltage is not produced.

According to the second aspect of the present invention, a semiconductor device for controlling an input current in a semiconductor chip to provide an output current, comprises: (a) a metal base plate having a major surface; (b) a first insulating substrate disposed on the major surface of the metal base plate; (c) a first conductive layer provided on the first insulating substrate and having a first region for conducting one of the input and output currents in a first direction parallel to the major surface, and a second peninsular region continuous with the first region and protruding in a second direction different from the first direction on the major surface; (d) a second insulating substrate provided on the first region; (e) a second conductive layer provided on the second insulating substrate and having a portion for conducting the other current in a third direction antiparallel to the first direction, the portion overlying the first region of the first conductive layer; and (f) at least one semiconductor chip provided on the second region and connected electrically to the first and second conductive layers.

When the at least one semiconductor chip includes a plurality of semiconductor chips spaced in the first direction, it is preferable that there be provided a slit substantially parallel to the second direction in a portion corresponding to the spacing in the second region.

In the semiconductor device according to the second aspect, in particular, the second region of the second conductive layer on which the semiconductor chip is disposed has a peninsular configuration. The input or output current flows in the second direction in which the peninsula extends.

The input current, by way of example, flowing in the first region in the first direction maintains its flowing direction up to the boundary between the first region and the second peninsular region. The input current changes its flowing direction to the second direction at the boundary, and then flows into the semiconductor chip in the second direction.

The output current from the semiconductor chip reaches the fourth conductive layer from the second peninsular region and flows in the fourth conductive layer in the third direction which is antiparallel to the first direction of the input current.

If the second region is not peninsular in configuration, the input current has a component which flows in the first region at a finite angle with respect to the first direction. Since the maximum reduced floating inductance is achieved when the input and output currents are completely antiparallel to each other, the peninsular shape of the second region enables the inductance reduction effect to be particularly enhanced.

The slit is formed in the portion corresponding to the spacing between the semiconductor chips, if in plurality, in the second region. This enhances the flow of the output or input current in the second region in the third direction.

According to the third aspect of the present invention, a semiconductor device for controlling an input current in a semiconductor chip to provide an output current, comprises: (a) a metal base plate having a major surface; (b) an insulating substrate disposed on the major surface of the metal base plate; (c) a conductive layer provided on the insulating substrate for conducting one of the input and output currents in a first direction parallel to the major surface; (d) a semiconductor chip disposed on the conductive layer; and (e) a wire connected electrically to an upper surface of the semiconductor chip and extending above the conductive layer in a second direction antiparallel to the first direction for conducting the other current.

In the semiconductor device of the third aspect, the input current flowing in one of the conductive layer and the wire is antiparallel to the output current flowing in the other. This affords the reduction in floating inductance between the input and output current paths.

Therefore, the semiconductor device according to the present invention is not broken down if the switching frequency being used is increased.

The present invention is also intended as an appropriate method of fabricating the foregoing semiconductor devices.

An object of the present invention is to provide a semiconductor device wherein a surge voltage produced in ON-to-OFF operation is not increased with an increase in switching frequency being used so that a semiconductor element is not broken down.

Another object of the invention is to provide a method of fabricating the above-mentioned semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<Whole Structure>

Figure 1:
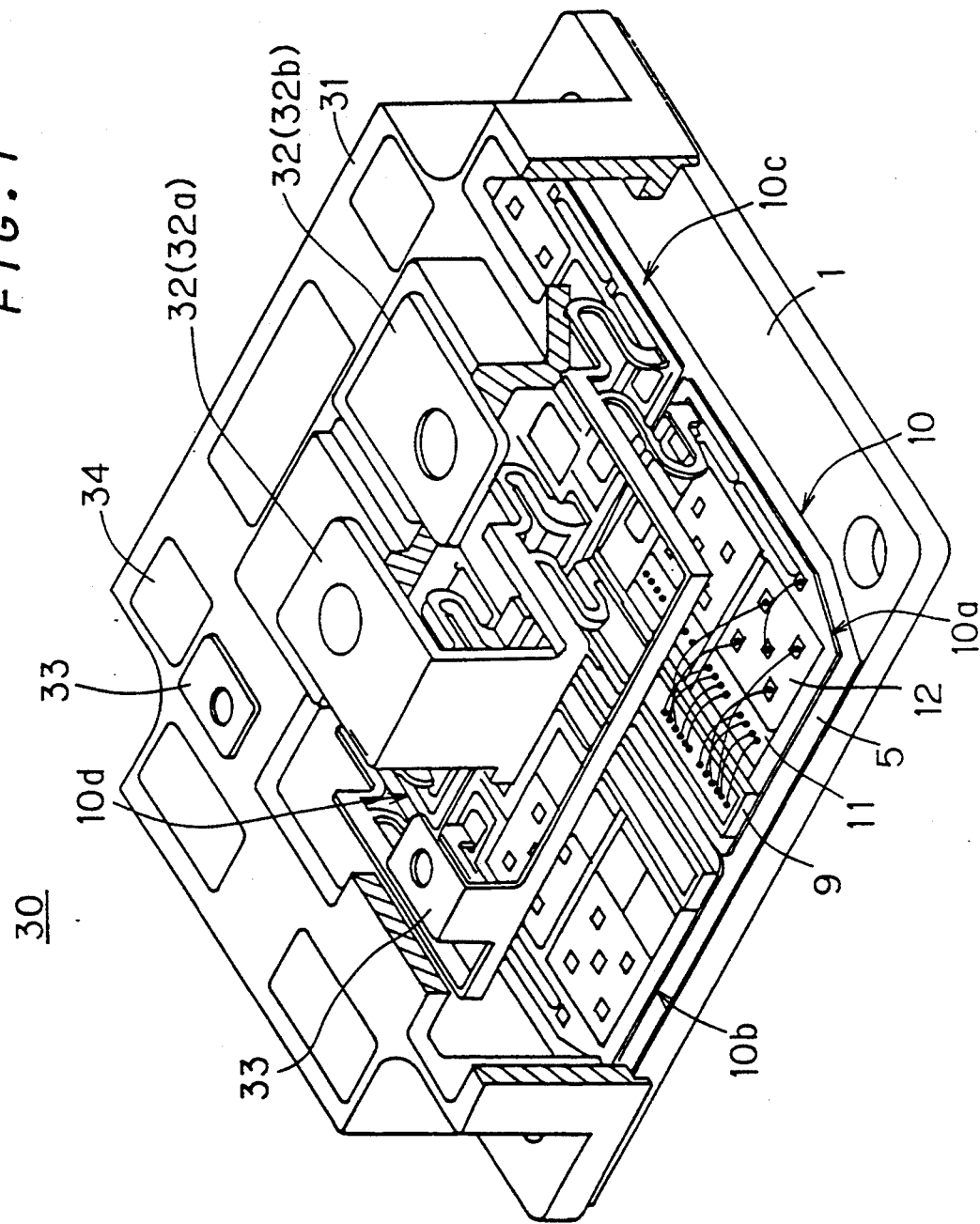
FIG. 1 is a cross-sectional view, with portions broken away, of a semiconductor device of a preferred embodiment according to the present invention.
Figure 2:
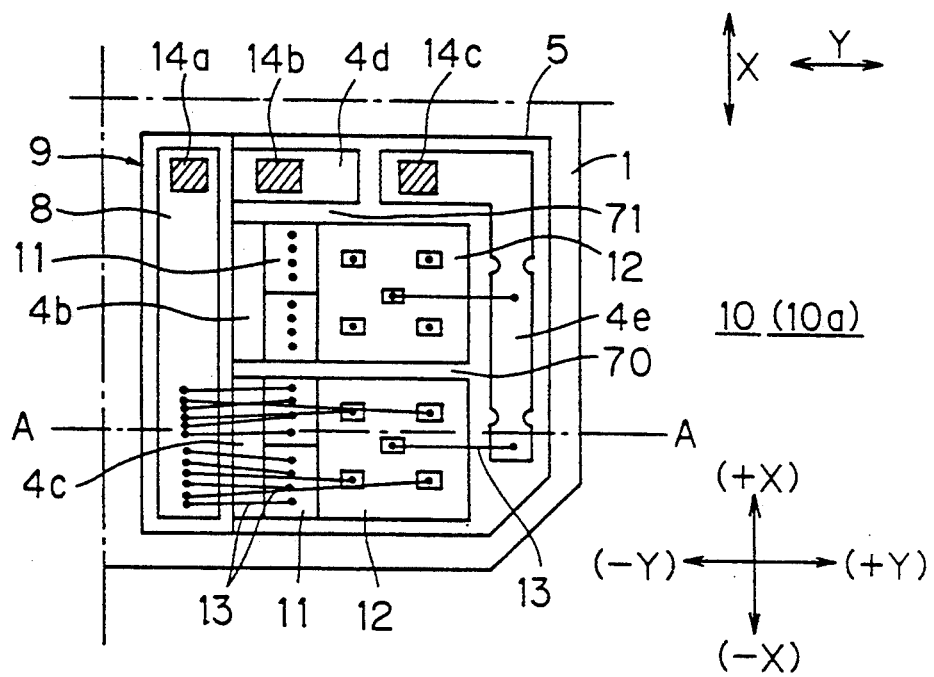
FIG. 2 is a partial plan view of a power module included in the semiconductor device of FIG. 1.

FIG. 1 is a perspective view, with portions broken away for clarity, of a semiconductor device 30 of a preferred embodiment according to the present invention. FIG. 2 is a plan view showing a quarter of a power module 10 included in the semiconductor device 30. The portion shown in FIG. 2 is equivalent to a unit module 10a. The power module 10 of FIG. 1 includes four unit modules 10a to 10d.

Referring to FIG. 1, the power module 10 is fixed on a copper base plate 1. Main electrode terminals 32 (32a, 32b) and a control electrode terminal 33 are mounted upright on the upper surface of the power module 10.

The power module 10 is located in the bottom of the semiconductor device 30, and is housed in a case 31. The case 31 may be an insert case or an outsert case. An "insert case" is a case to which the electrode terminals 32, 33 have been previously attached, and an "outsert case" means a case to which the electrode terminals 32, 33 are attached as the case 31 is mounted to the copper base plate 1.

The case 31 has the shape of an open-bottomed box, the lower end thereof being soldered to the peripheral portion of the metal base plate 1. Resin is introduced into the case 31 through a hole 34 formed on the top of the case 31, and is heated to harden, whereby the power module 10 and the electrode terminals 32, 33 are sealed.

<Structure of Power Module 10>

Figure 3:
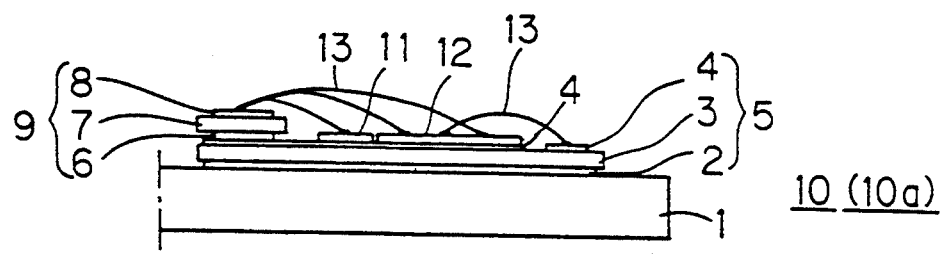
FIG. 3 is a cross-sectional view of the power module taken along the line A—A of FIG. 2.

FIG. 3 is a cross-sectional view taken along the line A—A of FIG. 2.

Referring to FIGS. 2 and 3, the power module 10 includes a first composite substrate (laminate) 5 disposed on the upper major surface of the metal base plate 1. The first composite substrate 5 includes a ceramic insulating substrate 3 made principally of $Al_2O_3$ or AlN, a copper pattern 4 deposited on the upper major surface of the ceramic insulating substrate 3, and a copper layer 2 deposited over most of the lower major surface of the ceramic insulating substrate 3.

Figure 4:
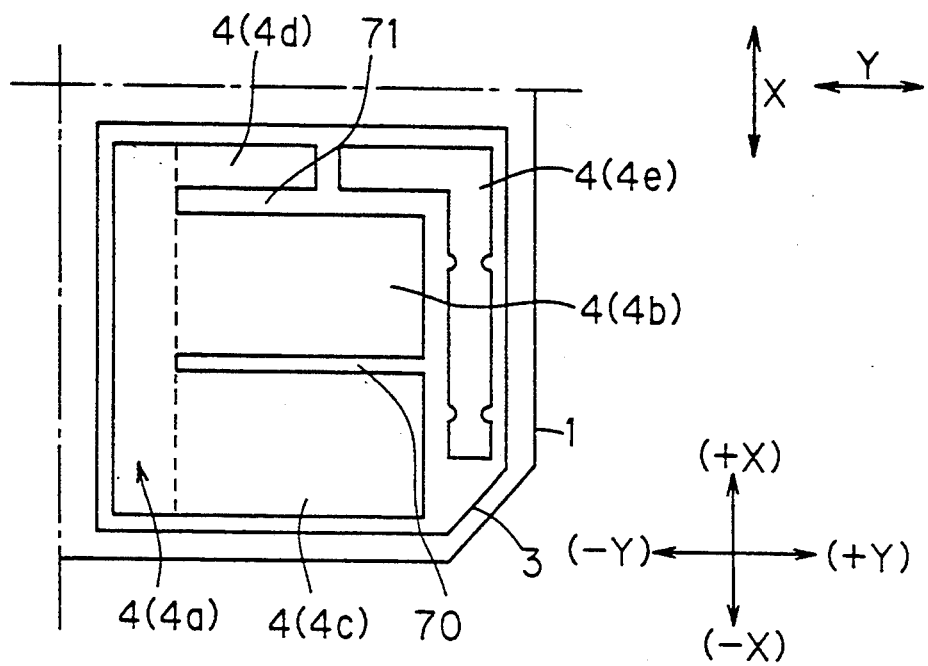
FIG. 4 is a partial plan view of a first composite substrate of the power module of FIG. 2.

FIG. 4 shows only the first composite substrate 5 on the metal base plate 1 in plan view. As shown in FIG. 4, the copper pattern 4 is roughly divided into five regions 4a to 4e. The broken line of FIG. 4 is a phantom line conceptually showing the boundary between the region 4a and the regions 4b to 4d. In practice, the region 4a is continuous with the regions 4b to 4d.

The first region 4a is a strip-shaped region extending in the direction X of FIG. 4 parallel to the upper major surface of the metal base plate 1. The second regions 4b, 4c are of peninsular configuration extending from a side of the first region 4a in the direction Y of FIG. 4 substantially perpendicular to the X direction. A slit 70 is formed between the second regions 4b and 4c. The slit 70 extends in the Y direction, and the deepest portion thereof reaches the first region 4a.

The third region 4d extends from an end of the first region 4a in the Y direction. A slit 71 is formed between the third region 4d and the second region 4b.

The fourth region 4e is provided in a position isolated from the first to third regions 4a to 4d.

Referring again to FIGS. 2 and 3, a second composite substrate 9 is provided on the upper major surface of the first region 4a (FIG. 4) of the conductive pattern 4 of the first composite substrate 5. The second composite substrate 9 includes a ceramic insulating substrate 7 made principally of $Al_2O_3$ or AlN, a copper pattern 8 deposited over most of the upper major surface of the ceramic insulating substrate 7, and a copper layer 6 deposited over most of the lower major surface of the ceramic insulating substrate 7.

Figure 5:
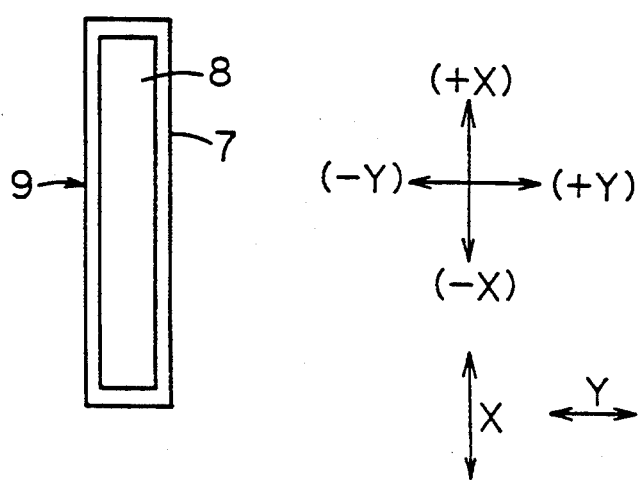
FIG. 5 is a partial plan view of a second composite substrate of the power module of FIG. 2.

The size of the second composite substrate 9 in plan is smaller than that of the first composite substrate 5 and is generally equivalent to that of the first region 4a (FIG. 4) of the conductive pattern 4. FIG. 5 is a plan view of the second composite substrate 9. A copper layer 8 is a copper strip extending in the X direction of FIG. 5. A copper layer 6 not shown in FIG. 5 on the lower major surface of the ceramic insulating substrate 7 is also a copper strip extending in the X direction.

Preferably, the thicknesses of the copper patterns 4, 8 and the copper layers 2, 6 are from 0.1 to 0.5 mm, respectively. The spacing between the copper pattern 4 and the copper layer 2 and the spacing between the copper pattern 8 and the copper layer 6 are preferably from 0.5 to 1.5 mm. This result is achieved by selecting the thickness of the respective ceramic insulating substrates 3, 6 to be 0.5 to 1.5 mm.

Referring again to FIGS. 2 and 3, a plurality of power semiconductor chips 12 and a plurality of flywheel diode chips 11 are soldered onto the second regions 4b, 4c of the copper pattern. The power semiconductor chips 12 are IGBTs (insulated gate bipolar transistors) each of which has an emitter and a gate on the upper major surface thereof and a collector on the lower major surface thereof. Each of the flywheel diode chips 11 has a cathode on the upper major surface thereof and an anode on the lower major surface thereof.

One power semiconductor chip 12 and two flywheel diode chips 11 make one set, and a plurality of sets of chips 12, 11 are spaced in the X direction.

Aluminum wires 13 extending substantially in the Y direction are placed between the copper pattern 8 of the second composite substrate 9 and the upper major surface (cathode) of the flywheel diode chips 11, between the copper pattern 8 and the emitter on the upper major surface of the power semiconductor chips 12, and between the fourth region 4e of the copper pattern 4 and the gate on the upper major surface of the power semiconductor chips 12. The aluminum wires associated with the semiconductor chips 11, 12 illustrated on the upper side of FIG. 2 are not shown in FIG. 2.

Figure 6:
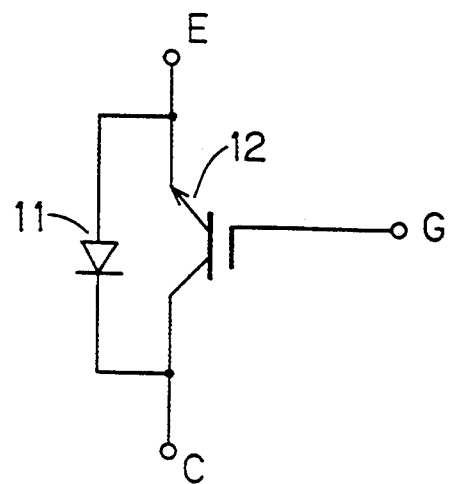
FIG. 6 is a circuit diagram of the power module of FIG. 2.

FIG. 6 is an equivalent circuit diagram of the unit module 10a of the present preferred embodiment having such wiring.

Referring to FIG. 2, an area 14a is defined in a (+X)-side end portion of the copper pattern 8. The main electrode terminal 32a of FIG. 1 is connected to the area 14a. An area 14b is defined in the third region 4d of the copper pattern 4. The main electrode terminal 32b of FIG. 1 is connected to the area 14b. The lower structure of the main electrode terminal 32b is not shown in FIG. 1.

An area 14c is defined in a (+X)-side portion of the fourth region 4e of the copper pattern 4 of FIG. 2. The control electrode terminal 32a of FIG. 1 is connected electrically to the area 14c.

The other unit modules 4b to 4d of FIG. 1 have the same structure as the unit module 4a.

<Operation and Characteristics>

A positive voltage is applied to the main electrode terminal 32b of FIG. 1, and a negative voltage is applied to the main electrode terminal 32a. A control voltage which is positive relative to the voltage applied to the main electrode terminal 32a is applied to the control electrode terminal 33. Then the power semiconductor chips 12 turn on. A current flow at this time will be described hereinafter.

Figure 7:
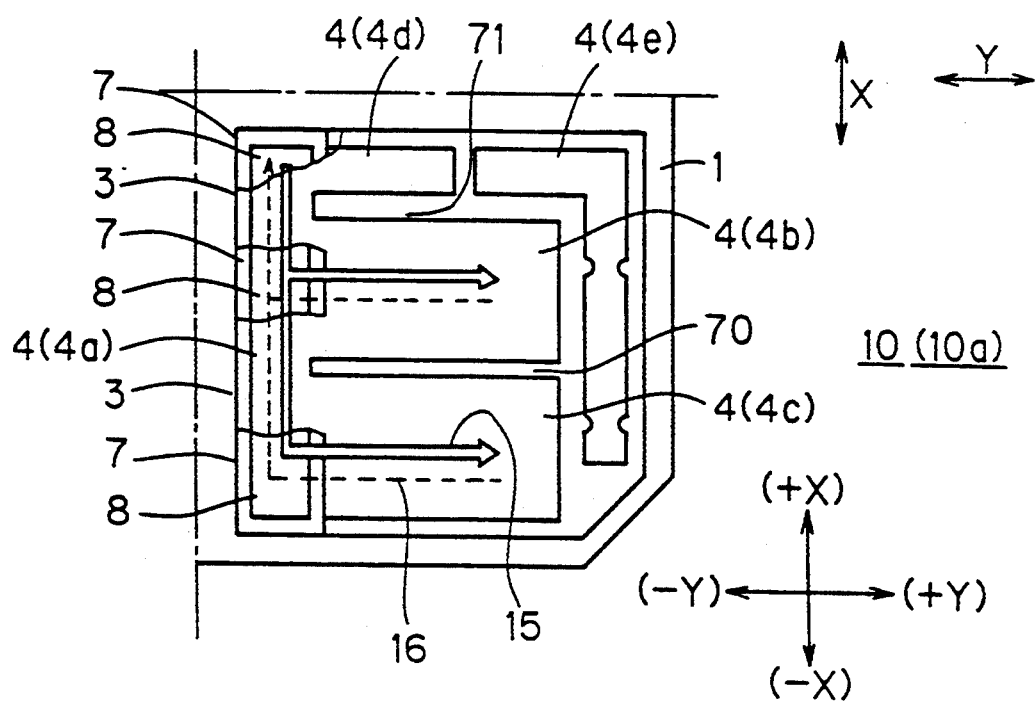
FIG. 7 shows a current path in the power module of FIG. 2.
Figure 8:
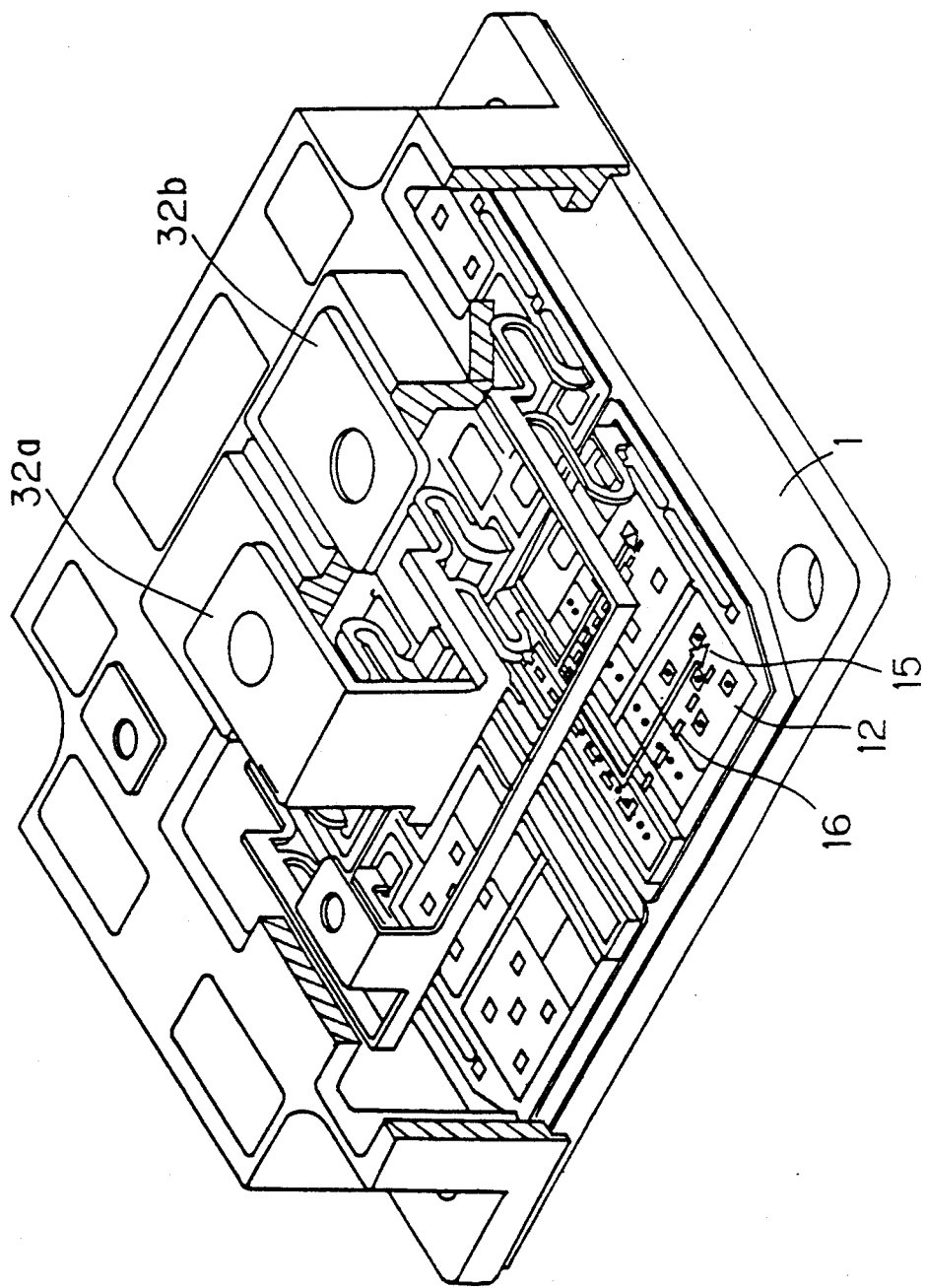
FIG. 8 shows a current path in the semiconductor device of FIG. 1.

FIG. 7 is a plan view, with portions of the upper structure of FIG. 2 broken away. FIG. 8 shows the current flow of FIG. 1. The arrows 15 and 16 of FIGS. 7 and 8 indicate the paths of input and output currents, respectively, when the power semiconductor chips 12 conduct in the forward direction.

The input current flowing from the main electrode terminal 32b is directed from the area 14b of FIG. 2 to the third region 4d of the conductive pattern 4, and then reaches the first region 4a. The input current entering the first region 4a flows in the first region 4a in the (−X) direction. Since the copper layer 6 (FIG. 3) on the reverse side of the second composite substrate is soldered to the first region 4a, the input current flows in the copper layer 6 in the (−X) direction.

The input current changes its direction to the (+Y) direction as it reaches the boundary between the first region 4a and the second regions 4b, 4c, to flow into the second regions 4b, 4c.

The input current flowing in the second regions 4b, 4c in the (+Y) direction flows into the lower major surface or the collector of the power semiconductor chips 12.

The input current path is shown as the path 15.

On the other hand, the output current flowing out of the emitter on the upper major surface of the power semiconductor chips 12 is directed through the aluminum wires 13 to the copper pattern 8. Since the aluminum wires 13 extend substantially in the Y direction, the output current is antiparallel to the input current flowing in the second regions 4b, 4c.

It is well known in the art of electromagnetism that the floating inductance of parallel forward and return conductors is in general low. For this reason, the current path formed by the second regions 4b, 4c and the aluminum wires 13 has a small floating inductance.

The output current changes its direction to the (+X) direction as it reaches the copper pattern 8 through the aluminum wires 13. The output current flows to the area 14a in the (+X) direction, and then flows to the exterior from the area 14a through the main electrode terminal 32a.

The direction of the input current flowing in the first region 4a of the copper pattern 4 is antiparallel to that of the output current flowing in the copper pattern 8. That is, the input current flows in the (−X) direction and the output current flows in the (+X) direction in these portions. This provides for a small inductance of the main current path in these portions. In particular, since the copper pattern 8 is disposed just above the first region 4a, a substantial reduction in the floating inductance is achieved.

The aluminum wires 13 and the second peninsular regions 4b, 4c enable the reduction in floating inductance by the antiparallel combination of "lines" (wires 13) and "planes" (regions 4b, 4c). The first region pattern 4 and the copper pattern 8 enable the reduction in floating inductance by the antiparallel combination of a "plane" (copper pattern 4) and a "plane" (region 4a ). The use of both combinations affords remarkable effects in reducing the floating inductance in the semiconductor device 30 of the present invention.

The semiconductor device 30 that has a low floating inductance in the main current path for the above-mentioned reasons has a small surge voltage V=L·di/dt when the rate of current change di/dt rises in ON-to-OFF and OFF-to-ON operations due to an increasing switching frequency. Thus the power semiconductor chips 12 are effectively prevented from breaking down.

<Slits 70, 71>

The reason for provision of the slits 70, 71 in the structure of FIGS. 2 and 7 will be discussed hereinafter.

The slit 70 is located between two pairs of semiconductor chips, and the slit 71 is located between the second region 4b and the third region 4d of the copper pattern 4.

Figure 9:
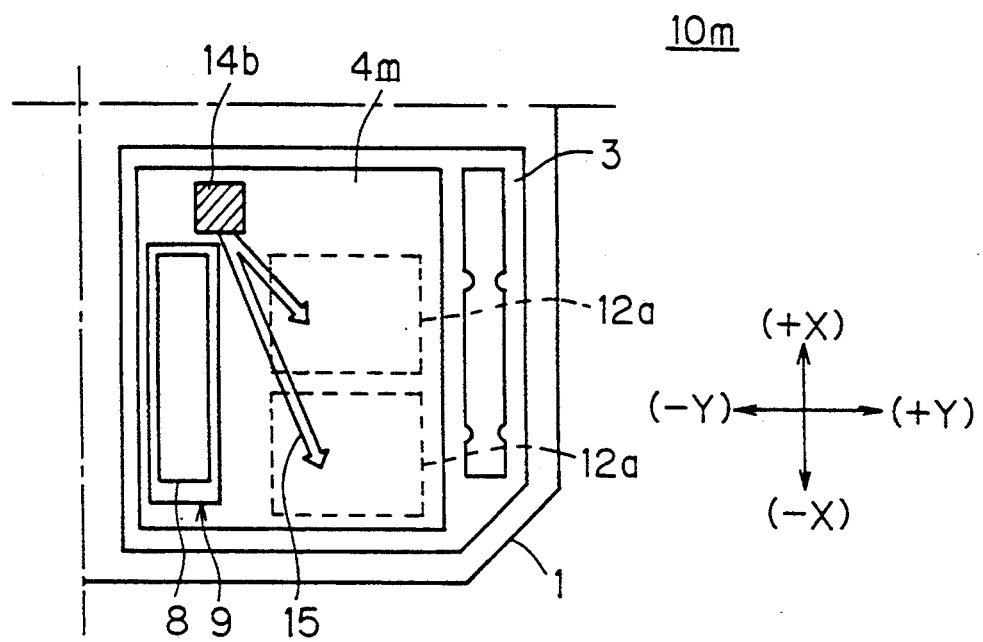
FIG. 9 shows a comparable example of the power module of FIG. 2.

For explanation of the functions of the slits 70, 71, it is assumed that the slits 70, 71 are absent. FIG. 9 shows a structure wherein the slits 70, 71 are absent. In FIG. 9, a copper pattern 4m is rectangular and the area 14b to be connected to the main electrode terminal 32b of FIG. 1 is located in an end portion of the copper pattern 4m. Regions 12a represent positions in which the semiconductor chips 12 and the like are to be mounted.

In the case of FIG. 9, the current path 15 of the input current does not run just under the copper pattern 8 of the second composite substrate 9. In addition, the current path 15 runs in oblique directions. Thus the input and output currents are not completely antiparallel to each other, and the distance between the input and output currents is long, resulting in less effective reduction of the floating inductance.

The semiconductor device of the present preferred embodiment of FIG. 2 having the slits 70, 71, however, is capable of forcing the input current path 15 to run in the (−X) direction (FIG. 7) and then to change its direction to the (+Y) direction so as to provide an L-shaped path. Furthermore, the input current path 15 runs adjacent the output current path 16, providing great effect in cancelling the magnetic fields mutually.

<Fabrication Method>

The semiconductor device 30 is fabricated, for example, in a manner to be described hereinafter.

First prepared is the first composite substrate 5 including the insulating substrate 3, the copper pattern 4 deposited on the upper major surface of the insulating substrate 3, and the copper layer 2 deposited on the lower major surface of the insulating substrate 3. Also prepared is the second composite substrate 9 including the insulating substrate 7, the copper pattern 8 deposited on the upper major surface of the insulating substrate 7, and the copper layer 6 deposited on the lower major surface of the insulating substrate 7. The size of the second composite substrate 9 is determined in accordance with the size of the first region 4a of the copper pattern 4 of the first composite substrate 5.

The first composite substrate 5 is joined to the upper major surface of the metal base plate 1 such that the copper layer 2 is positioned in face-to-face relation to the upper major surface of the metal base plate 1. The second composite substrate 9 is joined onto the first region 4a of the copper pattern 4 of the first composite substrate 5.

The junction may be made by means of a direct-connect process or an activated metal process. Specifically, the junction is achieved by high-temperature brazing using hard solder or by using, as junction layers, copper oxide provided by heating the copper layers 2, 4, 6, 8 in an atmosphere of oxygen.

Figure 10:
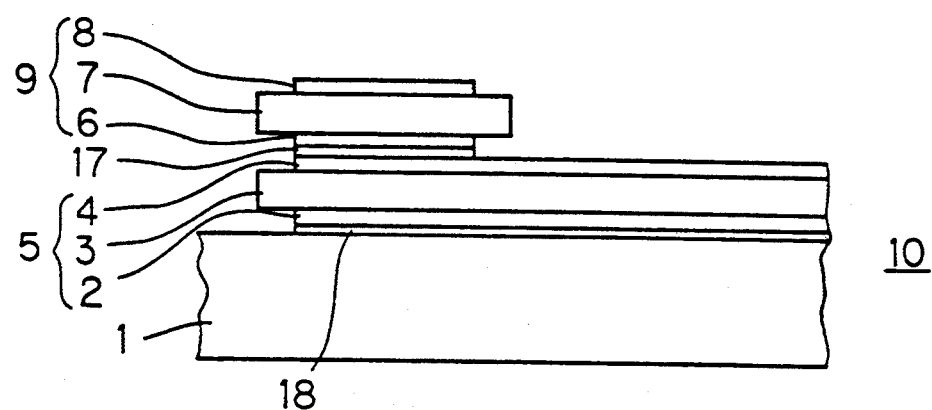
FIG. 10 is a cross-sectional view showing a fabrication process of the power module of FIG. 2.

FIG. 10 shows the power module after the junction. The metal base plate 1, the first laminate 5, and the second laminate 9 are joined together with junction layers 18, 17.

The flywheel diode chips 11 and the power semiconductor chips 12 are soldered onto the second regions 4b, 4c of the copper pattern 4. The wires 13 are laid between the semiconductor chips 11, 12 and the copper patterns 8, 4e to bond the ends of the wires 13 to the semiconductor chips 11, 12 and the copper patterns 8, 4e.

The power module provided in the foregoing manner is housed in the case 31 (FIG. 1). Almost simultaneously, the electrode terminals 32, 33 (FIG. 1) are joined to the corresponding areas 14a to 14d (FIG. 2

Resin is introduced into the case 31 through the hole 34 formed in the upper surface of the case 31, and is then heated to harden. The semiconductor chips 11, 12, the wires 13 and their vicinities may be protected with silicone gel or the like.

<Other Preferred Embodiments>

(1) A laminate including two insulating substrates may be deposited on the metal base plate 1 in place of the two composite substrates 5, 9 of the foregoing preferred embodiment.

Figure 11:
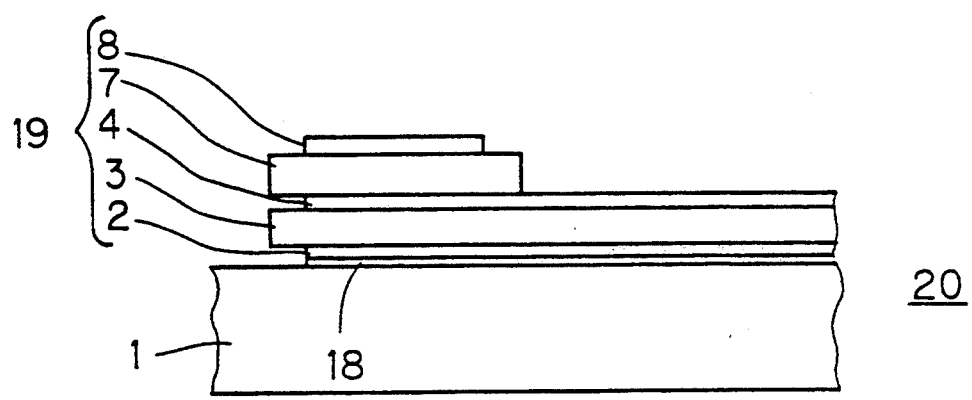
FIG. 11 is a cross-sectional view showing another fabrication process of the power module of FIG. 2.

The present invention may be accomplished, for example, by joining a laminate 19 including three copper patterns 2, 4, 8 and two insulating substrates 3, 7 to the metal base plate 1 with solder 18, as shown in FIG. 11.

In this case, it is preferable that the thickness of the respective metal patterns 2, 4, 8 be 0.1 to 0.5 mm. The spacing between the copper patterns 4, 8 is preferably selected from the range of 0.5 to 1.5 mm.

Figure 12:
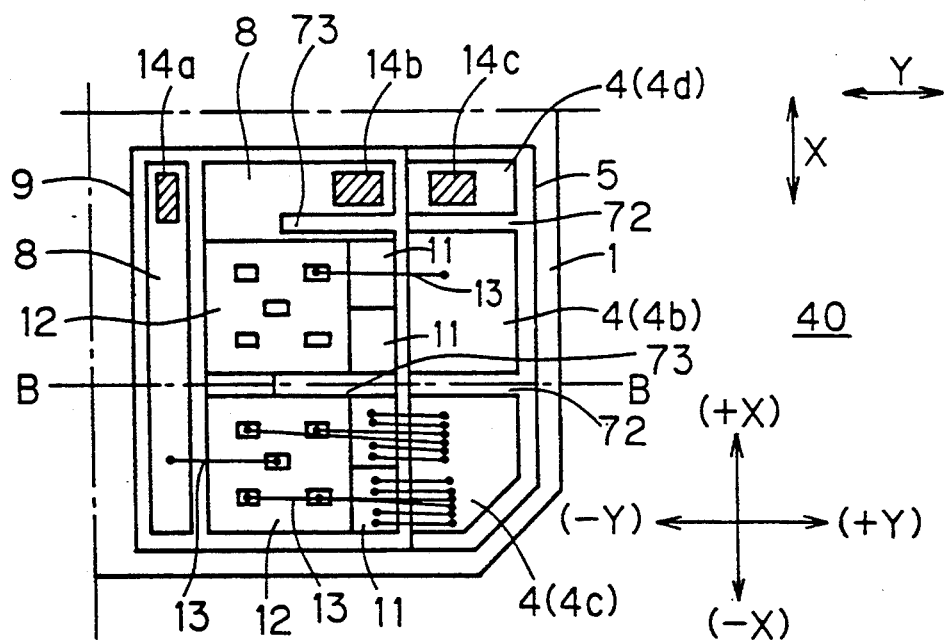
FIG. 12 is a partial plan view of a power module included in a semiconductor device of another preferred embodiment according to the present invention.
Figure 13:
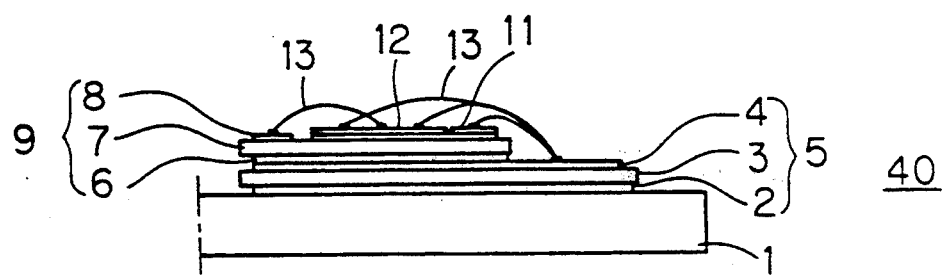
FIG. 13 is a cross-sectional view of the power module taken along the line B—B of FIG. 12.
Figure 14:
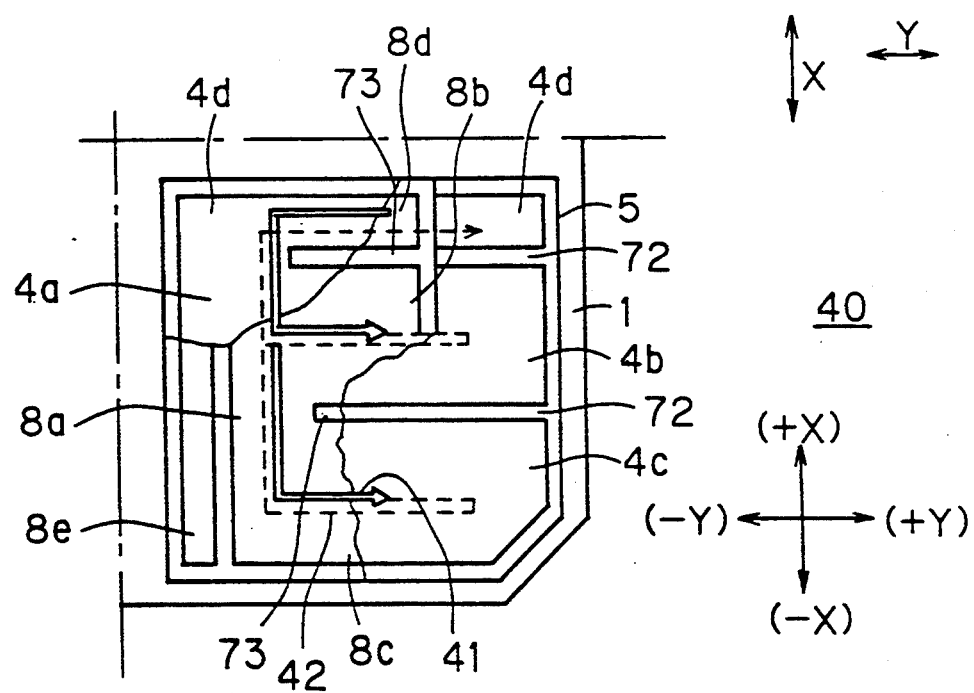
FIG. 14 shows a current path in the power module of FIG. 12.
Figure 15:
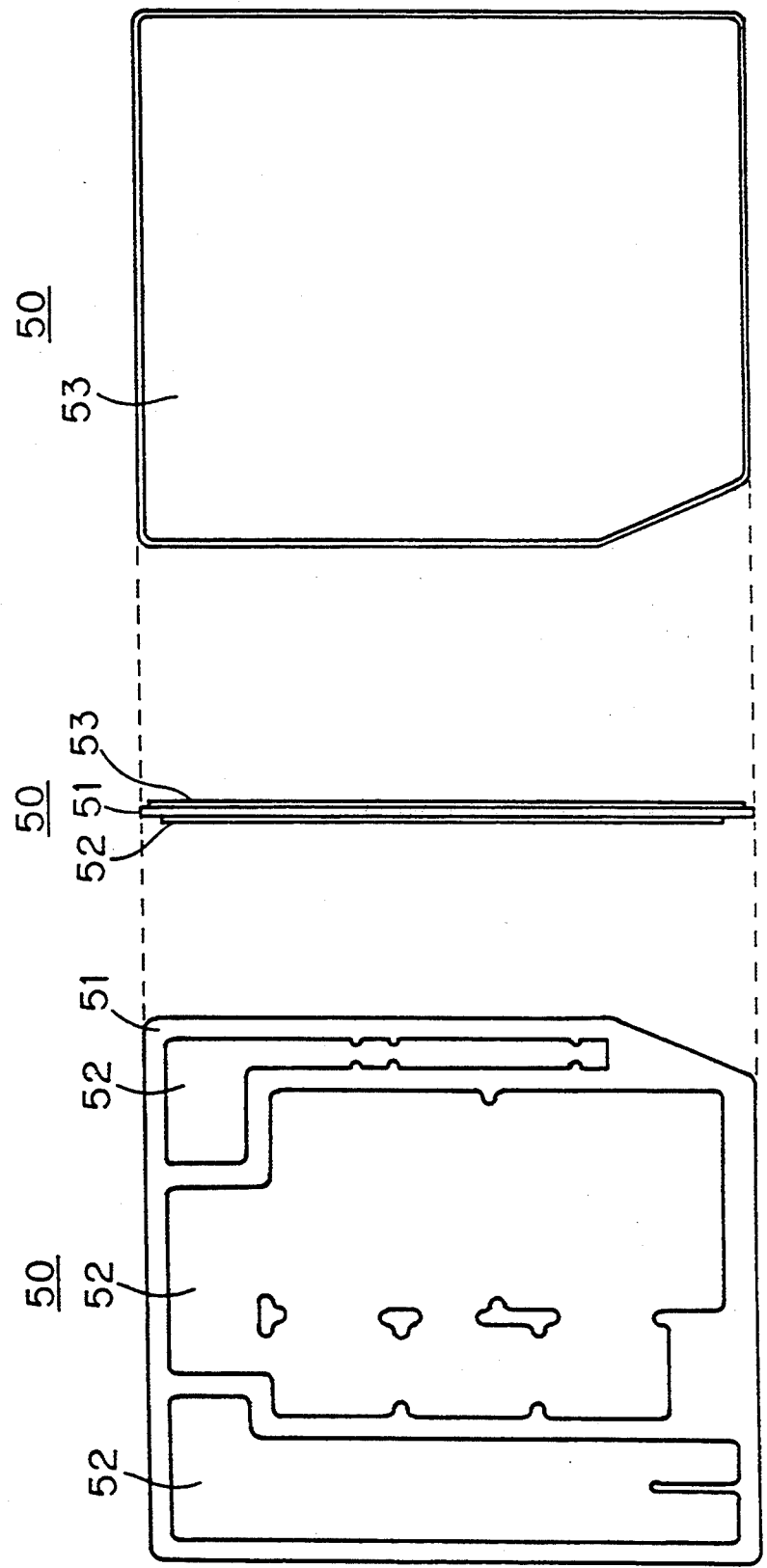
FIG. 15 shows a composite substrate with thick copper foil for use in a conventional semiconductor device.
Figure 16:
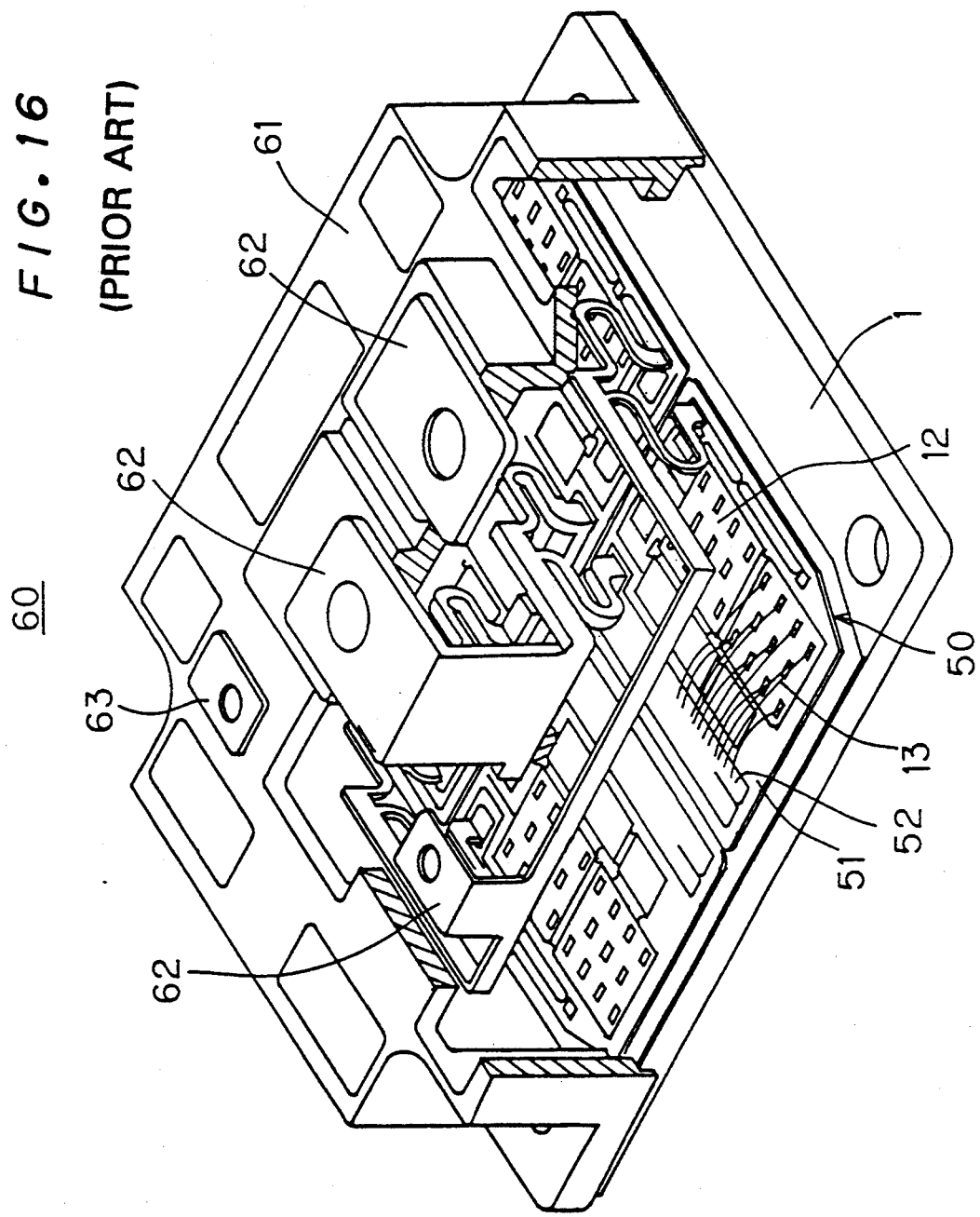
FIG. 16 is a perspective view, with portions broken away, of the conventional semiconductor device.
Figure 17:
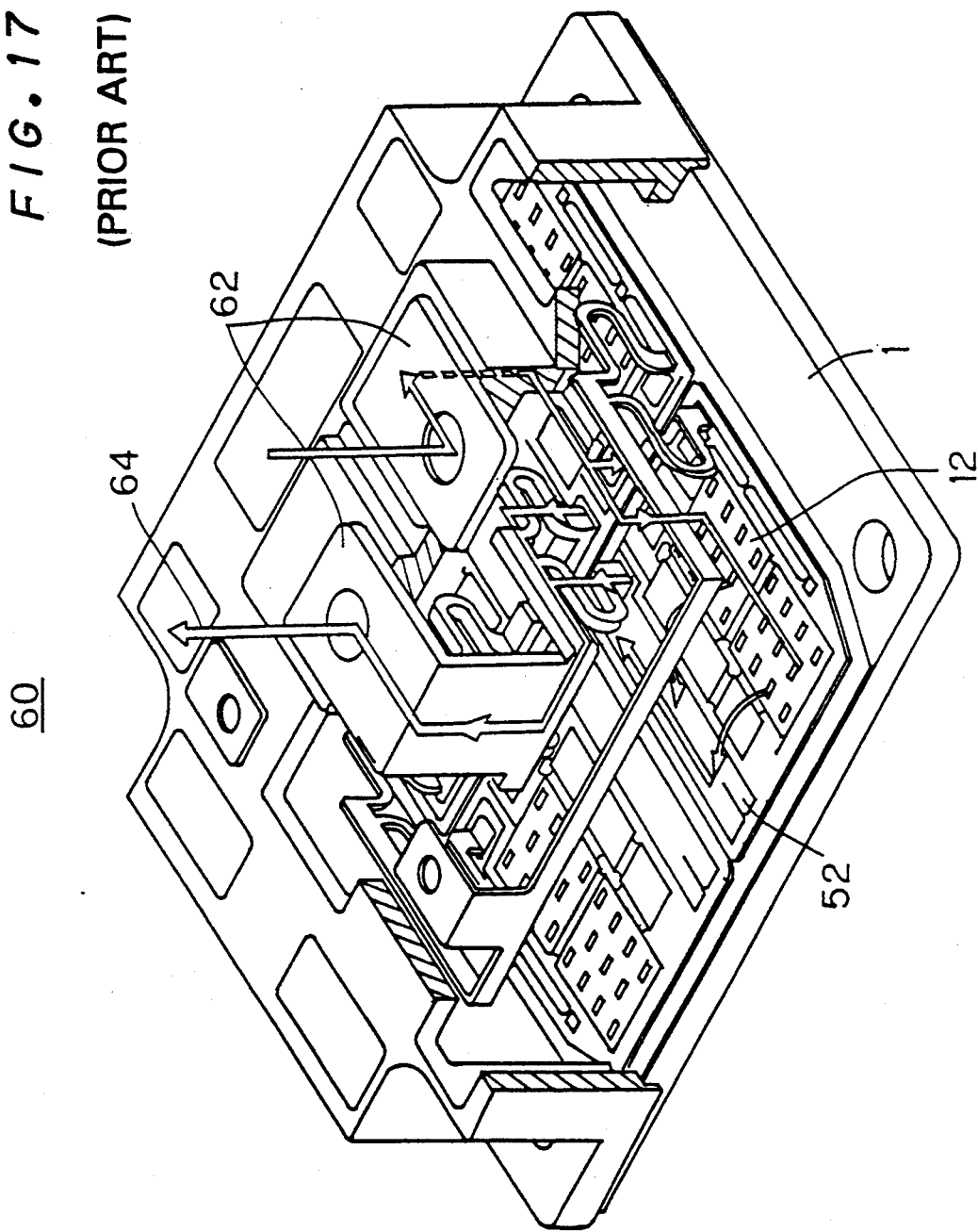
FIG. 17 shows a current path in the semiconductor device of FIG. 16.

(2) Although the input current path is on the lower side and the output current path is on the upper side in the power module 10 of the above-mentioned preferred embodiment, the input current path may be on the upper side when the output current path is on the lower side. FIG. 12 is a plan view of a power module 40 in such case, and FIG. 13 is a cross-sectional view taken along the line B—B of FIG. 12. FIG. 14 shows current paths in the power module 40, with portions of the upper structure of FIG. 12 broken away.

The copper pattern 4 formed on the upper major surface of the first composite substrate 5 includes, as shown in FIG. 14, the first region 4a extending in the X direction, the second peninsular regions 4b, 4c extending from the first region 4a in the (+Y) direction, and the third region 4d in which the area 14c (FIG. 12) for connection of the terminal is defined. Slits 72 are formed between the regions 4b, 4c, 4d.

The second composite substrate 9 having a size in plane smaller than the first composite substrate 5 is joined to the first composite substrate 5. The copper pattern 6 formed on the lower major surface of the second composite substrate 9 is adapted to fit the copper pattern 4.

The copper pattern 8 is formed on the upper major surface of the second composite substrate 9. The copper pattern 8 includes a region 8a (FIG. 14) extending in the X direction, regions 8b, 8c of peninsular configuration extending from the region 8a in the Y direction, a region 8d extending parallel to the region 8b, and a region 8e isolated from the regions 8a to 8d. Slits 73 are formed between the regions 8b, 8c, 8d.

The semiconductor chips 11, 12 (FIG. 12) are joined to the regions 8b, 8c. The wires 13 extending in the Y direction connect the semiconductor chips 11, 12 to the copper patterns 8e, 4b, 4c. The other structures of the power module 40 are identical with those of the power module 10 of FIG. 2.

In the power module 40 of FIGS. 12 to 14, an input current 41 from the area 14b (FIG. 12) flows in the region 8d (FIG. 14) in the (−Y) direction, and then flows in the region 8a in the (−X) direction. The input current changes its direction to the (+Y) direction at the boundary between the region 8a and the regions 8b, 8d, and then reaches the lower major surface of the power semiconductor chips 12 through the regions 8b, 8c.

The output current from the upper major surface of the power semiconductor chips 12 flows through the wires 13 to the copper pattern regions 4b, 4c of the first composite substrate 5. The output current further flows in the copper pattern regions 4b, 4c in the (−Y) direction as illustrated as a path 42 in dotted lines. The output current changes its direction to the (+X) direction, and flows in the copper pattern region 4a of the first composite substrate 5 just under the copper pattern region 8a of the second composite substrate 9 in the (+X) direction.

The output current changes its direction to the (+Y) direction as it reaches the copper pattern region 4d to flow out from the area 14c (FIG. 12) to the main electrode terminal.

In the power module 40, the input and output current paths 41 and 42 are antiparallel to each other. This provides for a small floating inductance and effective prevention of breakdown due to the surge voltage in high-speed switching. The slits 72, 73 are provided fir the same reason as in the power module 10 of FIG. 2.

(3) Although the above-mentioned preferred embodiments employ the power module including two insulating substrates, more insulating substrates and copper patterns may be used. In such a case, the input and output current paths may be adapted to be antiparallel to each other. The copper patterns may be replaced with other conductive patterns such as aluminum patterns.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device for controlling an input current flowing to a semiconductor chip to provide an output current comprising:
    (a) a metal base plate having a major surface;
    (b) a first insulating substrate disposed on said major surface of said metal base plate;
    (c) a first conductive layer disposed on said first insulating substrate and having a first portion for conducting one of an input current and an output current in a first direction parallel to said major surface;
    (d) a second insulating substrate disposed on part of said first conductive layer;
    (e) a second conductive layer disposed on said second insulating substrate and having a second portion for conducting the other of the input an output currents in a second direction antiparallel to said first direction, said second portion overlying said first portion; and
    (f) a semiconductor chip disposed on one of said first and second conductive layers and electrically connected to said first and second conductive layers.

2. The semiconductor device of claim 1, further comprising:
    (g) a first electrode electrically connected to an end of said first conductive layer; and
    (h) a second electrode electrically connected to an end of said second conductive layer located on the same side said of said second insulating substrate as said end of said first conductive layer.

3. The semiconductor device of claim 2, further comprising:
    (i) a third conductive layer provided between said metal base plate and said first insulating substrate.

4. The semiconductor device of claim 3, wherein said semiconductor chip includes:
    (f-1) a power semiconductor element provided on said first conductive layer; and
    (f-2) a flywheel diode provided on said first conductive layer and connected in reverse polarity to said power semiconductor element.

5. The semiconductor device of claim 4, wherein the respective thickness of said first and second conductive layers is 0.1 to 0.5 mm.

6. The semiconductor device of claim 5, wherein a spacing between said first and second conductive layers is 0.5 to 1.5 mm.

7. The semiconductor device of claim 6, wherein said first and second conductive layers are substantially copper.

8. A semiconductor device for controlling an input current flowing to a semiconductor chip to provide an output current comprising:
    (a) a metal base plate having a major surface;
    (b) a first insulating substrate disposed on said major surface of said metal base plate;
    (c) a first conductive layer provided on said first insulating substrate and having a first region for conducting one of an input current and an output current in a first direction parallel to said major surface, and a second peninsular region continuous with said first region and protruding in a second direction different from said first direction on said major surface;
    (d) a second insulating substrate provided on said first region;
    (e) a second conductive layer provided on said second insulating substrate and having a portion for conducting the other of the input and output in a third direction antiparallel to said first direction, said portion overlying said first region of said first conductive layer; and (f) at least one semiconductor chip provided on said second region and electrically connected to said first and second conductive layers.

9. The semiconductor device of claim 8, wherein said at least one semiconductor chip includes (f-1) a plurality of semiconductor chips spaced in said first direction, and a slit substantially parallel to said second direction in a portion in said second region.

10. The method of claim 9, further comprising the steps of:

(g) a first electrode electrically connected to an end of said first region; and (h) a second electrode electrically connected to an end of said second conductive layer located on the same side of said second insulating substrate as said end of said first region.

11. The semiconductor device of claim 10, further comprising:

(i) a third conductive layer provided between said metal base plate and said first insulating substrate.

12. The semiconductor device of claim 11, wherein the respective thickness of said first and second conductive layers is 0.1 to 0.5 mm.

13. The semiconductor device of claim 12, wherein a spacing between said first and second conductive layers is 0.5 to 1.5 mm.

14. The semiconductor device of claim 13, wherein said first and second conductive layers are substantially copper.

15. A semiconductor device for controlling an input current flowing to a semiconductor chip to provide an output current, comprising:

(a) a metal base plate having a major surface;

(b) an insulating substrate disposed on said major surface of said metal base plate;

(c) a conductive layer provided on said insulating substrate for conducting on of an input current and output current in a first direction parallel to said major surface;

(d) a semiconductor chip disposed on said conductive layer; and (e) a wire electrically connected to an upper surface of said semiconductor chip and extending above said conductive layer in a second direction antiparallel to said first direction for conducting the other of the input and output currents.

16. The semiconductor device of claim 15, wherein said insulating substrate is a first insulating substrate, said conductive layer is a first conductive layer, and said semiconductor chip is a first semiconductor chip, said semiconductor device further comprising:

(f) a second conductive layer selectively formed on said first conductive layer; and (g) a second semiconductor chip disposed on said second conductive layer, said wire including:

(e-1) a first end electrically connected to said upper surface of said first semiconductor chip; and (e-2) a second end electrically connected to an upper surface of said second semiconductor chip.

17. The semiconductor device of claim 16, wherein said first conductive layer includes:

(c-1) a first region on which said first semiconductor chip is placed; and (c-2) a second peninsular region continuous with said first region and protruding in a second direction substantially perpendicular to said first direction on said major surface, wherein said second conductive layer is formed on said second region, and wherein the direction of a current flowing in said second conductive layer is antiparallel to that of a current flowing in said first region.

18. The semiconductor device of claim 17, wherein said first semiconductor chip includes:

(d-1) a plurality of first semiconductor chips spaced substantially in said first direction on said first region, and a slit substantially parallel to said first direction in a portion in said first conductive layer.

19. The semiconductor device of claim 18, further comprising:

(h) a first electrode connected electrically to an end of said first conductive layer; and (i) a second electrode connected electrically to an end of said second conductive layer located on the same side of said end of said first conductive layer.

20. The semiconductor device of claim 18, wherein the respective thickness of said first and second conductive layers is 0.1 to 0.5 mm.

21. The semiconductor device of claim 20, wherein a spacing between said first and second conductive layers is 0.5 to 1.5 mm.

22. The semiconductor device of claim 21, wherein said first and second conductive layers are substantially copper.

* * * * *

UNITED STATES PATENT AND TRADEMARK OFFICE
CERTIFICATE OF CORRECTION

PATENT NO. : 5,424,579
DATED : June 13, 1995
INVENTOR(S) : Arai et al.

It is certified that error appears in the above-indentified patent and that said Letters Patent is hereby corrected as shown below:

Column 10, Line 16, change "an" to --and--.

Column 11, Line 1, after "output" insert --current--.

Signed and Sealed this

Fifth Day of September, 1995

Attest:

BRUCE LEHMAN

*Attesting Officer*        *Commissioner of Patents and Trademarks*